(12) United States Patent
Kim et al.

(10) Patent No.: US 7,932,120 B2
(45) Date of Patent: Apr. 26, 2011

(54) METHODS OF MANUFACTURING CMOS IMAGE SENSORS

(75) Inventors: Ui-Sik Kim, Seongnam-si (KR); Young-Hoon Park, Suwon-si (KR); Won-Je Park, Yongin-si (KR); Dae-Cheol Seong, Seoul (KR); Yeo-Ju Yoon, Uijeongbu-si (KR); Bo-Bae Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 83 days.

(21) Appl. No.: 12/461,903

(22) Filed: Aug. 27, 2009

(65) Prior Publication Data

US 2010/0055823 A1 Mar. 4, 2010

(30) Foreign Application Priority Data

Aug. 28, 2008 (KR) .................. 10-2008-0084618

(51) Int. Cl.
*H01L 21/00* (2006.01)
*H01L 21/8238* (2006.01)

(52) U.S. Cl. ...... 438/59; 438/70; 438/200; 257/E21.632

(58) Field of Classification Search .................. 438/57, 438/59, 60, 70, 75, 200; 257/292, 294, E21.632
See application file for complete search history.

(56) References Cited

U.S. PATENT DOCUMENTS

| | | | |
|---|---|---|---|
| 6,218,210 B1 * | 4/2001 | Park | 438/57 |
| 7,057,219 B2 * | 6/2006 | Park et al. | 257/292 |
| 7,488,616 B2 * | 2/2009 | Hwang | 438/65 |
| 7,524,695 B2 * | 4/2009 | Rhodes | 438/60 |
| 2009/0166693 A1 * | 7/2009 | Kim | 257/292 |

FOREIGN PATENT DOCUMENTS

| | | |
|---|---|---|
| JP | 2002-190586 | 7/2002 |
| JP | 2007-150361 | 6/2007 |
| KR | 10-0508086 | 8/2005 |

* cited by examiner

*Primary Examiner* — Tuan N. Quach (74) *Attorney, Agent, or Firm* — Harness, Dickey & Pierce, P.L.C.

(57) ABSTRACT

Complementary metal-oxide semiconductor (CMOS) image sensors (CIS) and methods of manufacturing the same are provided, the sensors include an epitaxial layer on a substrate in which a first, second, third and fourth region are defined. A photodiode may be formed at an upper portion of the epitaxial layer in the first region. A plurality of gate structures may be formed on the epitaxial layer in the second, third and fourth regions. A first blocking layer may be formed on the gate structures and the epitaxial layer in the first and second regions. A first impurity layer may be formed at an upper portion of the epitaxial layer adjacent to the gate structures in the second region, and a second impurity layer at upper portions of the epitaxial layer adjacent to the gate structures in the third and fourth regions. A color filter layer may be formed over the photodiode. A microlens may be formed on the color filter layer.

8 Claims, 12 Drawing Sheets

METHODS OF MANUFACTURING CMOS IMAGE SENSORS

CROSS-RELATED APPLICATIONS

This application claims the benefit of priority under 35 U.S.C. §119 to Korean Patent Application No. 10-2008-0084618, filed on Aug. 28, 2008 in the Korean Intellectual Property Office (KIPO), the contents of which are herein incorporated by reference in their entirety.

BACKGROUND

1. Field

Example embodiments relate to complementary metal-oxide semiconductor (CMOS) image sensors (CIS) and methods of manufacturing the same. Other example embodiments relate to complementary metal-oxide semiconductor (CMOS) image sensors (CIS) having increased characteristics and methods of manufacturing the same.

2. Description of the Related Art

Generally, a complementary metal-oxide semiconductor image sensor (CIS) includes an active pixel sensor (APS) array region and a peripheral circuit region. In the APS array region, a transfer transistor may be formed between a photodiode and a floating diffusion layer. For the purpose of simplifying the fabrication process, impurity regions may be formed in the floating diffusion layer and the peripheral circuit region by the same ion implantation process using the same mask. Undesired impurities (e.g., metal ions) may be introduced to the floating diffusion layer or the photodiode such that white spots, or dark currents, occur. The occurrence of the white spots, or dark currents, may cause the CIS to have a substantially low resolution and a distorted picture.

SUMMARY

Example embodiments relate to complementary metal-oxide semiconductor (CMOS) image sensors (CIS) and methods of manufacturing the same. Other example embodiments relate to complementary metal-oxide semiconductor (CMOS) image sensors (CIS) having increased characteristics and methods of manufacturing the same.

Example embodiments provide a complementary metal-oxide semiconductor (CMOS) image sensor (CIS) without white spots. Example embodiments provide a method of manufacturing a complementary metal-oxide semiconductor (CMOS) image sensor (CIS) without white spots.

According to example embodiments, there is provided a method of manufacturing a complementary metal-oxide semiconductor image sensor (CIS). In the method, an epitaxial layer may be formed on a substrate in which a first, second, third and fourth region are defined. A photodiode may be formed at (or in) an upper portion of the epitaxial layer in the first region. A plurality of gate structures may be formed on the epitaxial layer in the second, third and fourth regions. A first blocking layer may be formed on the gate structures and the epitaxial layer. A lightly-doped impurity layer may be formed at (or in) an upper portion of the epitaxial layer using a first mask and the gate structures as an ion implantation mask. The first mask covers the first region and a portion of the second region. A first highly-doped impurity layer may be formed at an (or in) upper portion of the epitaxial layer using a second mask and the gate structures as an ion implantation mask. The second mask covers the first, third and fourth regions. A second highly-doped impurity layer is formed at (or in) an upper portion of the epitaxial layer using a third mask and the gate structures as an ion implantation mask. The third mask covers the first and second regions. A color filter layer may be formed over the photodiode. A microlens may be formed on the color filter layer.

In example embodiments, after forming the first highly-doped impurity layer, a nitride layer may be formed on the first blocking layer. The nitride layer may be partially removed using the third mask as an etching mask to form a second blocking layer and a spacer. The second blocking layer may be formed on the first blocking layer in the first and second regions. The spacer may be formed on each sidewall of the gate structures in the third and fourth regions.

In example embodiments, a portion of the first blocking layer beneath the nitride layer may be removed if the portion of the nitride layer is removed.

According to example embodiments, there is provided a method of manufacturing a complementary metal-oxide semiconductor image sensor (CIS). In the method, an epitaxial layer may be formed on a substrate in which a first, second, third and fourth region are defined. A photodiode may be formed at (or in) an upper portion of the epitaxial layer in the first region. A plurality of gate structures may be formed on the epitaxial layer in the second, third and fourth regions. A blocking layer may be formed on the gate structures and the epitaxial layer. A first lightly-doped impurity layer may be formed at (or in) an upper portion of the epitaxial layer using a first mask and the gate structures as an ion implantation mask. The first mask covers the first region, a portion of the second region, and a first portion of the fourth region. A first highly-doped impurity layer may be formed at (or in) an upper portion of the epitaxial layer using a second mask and the gate structures as an ion implantation mask. The second mask covers the first, third and fourth regions. A second lightly-doped impurity layer may be formed at (or in) an upper portion of the epitaxial layer using a third mask and the gate structures as an ion implantation mask. The third mask covers the first, second and third regions and a second portion of the fourth region. A second highly-doped impurity layer may be formed at (or in) an upper portion of the epitaxial layer using a fourth mask and the gate structures as an ion implantation mask. The fourth mask covers the first and second regions and the first portion of the fourth region. A third highly-doped impurity layer may be formed at (or in) an upper portion of the epitaxial layer using a fifth mask and the gate structures as an ion implantation mask. The fifth mask covers the first, second and third regions and the second portion of the fourth region. A color filter layer may be formed over the photodiode. A microlens may be formed on the color filter layer.

In example embodiments, the second lightly-doped impurity layer and the third highly-doped impurity layer may include first conductive type impurities. The first lightly-doped impurity layer and the first and second highly-doped impurity layers may include second conductive type impurities.

According to example embodiments, there is provided a CIS. The CIS includes an epitaxial layer, a photodiode, a plurality of gate structures, a first blocking layer, a first impurity layer, a second impurity layer, a color filter and a microlens. The epitaxial layer may be on a substrate in which a first, second, third fourth region are defined. The photodiode may be at an upper portion of the epitaxial layer in the first region. The gate structures are on the epitaxial layer in the second, third and fourth regions. The first blocking layer may be on the gate structures and the epitaxial layer in the first and second regions. The first impurity layer may be at (or in) an upper portion of the epitaxial layer adjacent to the gate structures in the second region. The second impurity layer may be at (or in) upper portions of the epitaxial layer adjacent to the gate structures in the third and fourth regions. The color filter layer may be over the photodiode. The microlens may be on the color filter layer.

In example embodiments, the CIS may include a second blocking layer on the first blocking layer.

In example embodiments, the CIS may include a spacer on sidewalls of the gate structures in the third and fourth regions.

In example embodiments, the second impurity layer may include a first conductive type impurity layer in a first portion of the fourth region, and a second conductive type impurity layer in the third region and a second portion of the fourth region. The first impurity layer may include second conductive type impurities.

In example embodiments, each of the first and second impurity layers may include a lightly-doped impurity layer and a highly-doped impurity layer on the lightly-doped impurity layer.

The CIS according to example embodiments may be in an imaging device (e.g., a camera phone).

According to example embodiments, in a method of manufacturing a CIS, a blocking layer may prevent (or reduce) undesired impurities from being diffused into a floating diffusion layer or a photodiode such that white spots may not occur. As such, the CIS may have increased resolution and/or increased electrical characteristics.

BRIEF DESCRIPTION OF THE DRAWINGS

Example embodiments will be more clearly understood from the following detailed description taken in conjunction with the accompanying drawings. FIGS. 1 to 19 represent non-limiting, example embodiments as described herein.

DETAILED DESCRIPTION OF EXAMPLE EMBODIMENTS

Various example embodiments will be described more fully hereinafter with reference to the accompanying drawings, in which example embodiments are shown. The present invention may, however, be embodied in many different forms and should not be construed as limited to the example embodiments set forth herein. Rather, these example embodiments are provided so that this disclosure will be thorough and complete, and will fully convey the scope to those skilled in the art. In the drawings, the sizes and relative sizes of layers and regions may be exaggerated for clarity.

It will be understood that if an element or layer is referred to as being "on," "connected to" or "coupled to" another element or layer, it can be directly on, connected or coupled to the other element or layer, or intervening elements or layers may be present. In contrast, if an element is referred to as being "directly on," "directly connected to" or "directly coupled to" another element or layer, there are no intervening elements, or layers, present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s), or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," if used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope.

Hereinafter, example embodiments will be explained in detail with reference to the accompanying drawings.

Example embodiments relate to complementary metal-oxide semiconductor (CMOS) image sensors (CIS) and methods of manufacturing the same. Other example embodiments relate to complementary metal-oxide semiconductor (CMOS) image sensors (CIS) having increased characteristics and methods of manufacturing the same.

FIGS. 1 to 13 are cross-sectional views illustrating a method of manufacturing a CIS in accordance with example embodiments.

Figure 1:
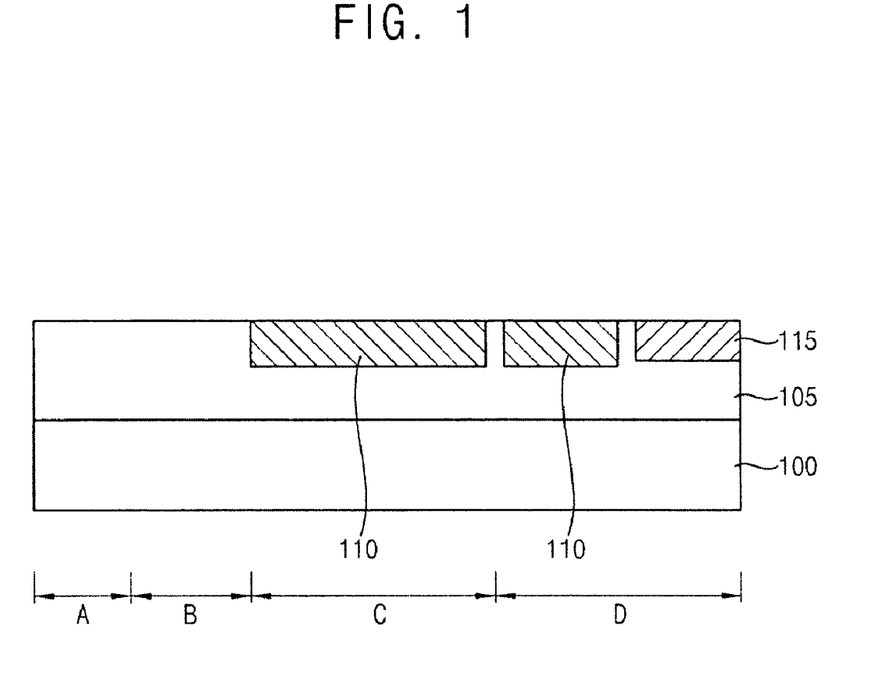
FIGS. 1 to 13 are cross-sectional views illustrating a method of manufacturing a CIS in accordance with example embodiments.

Referring to FIG. 1, a substrate 100 may include a first region A, a second region B, a third region C and a fourth region D. For example, the first, second, third and fourth regions A, B, C and D may be a photodiode region, a floating diffusion region, an active pixel sensor (APS) transistor region and a peripheral circuit region, respectively. In the second region B, a transfer transistor may be formed at a first portion thereof, and a floating diffusion layer may be formed at a second portion thereof. In the fourth region D, a first conductive type metal-oxide semiconductor (MOS) transistor may be formed in a first portion thereof and a second conductive type MOS transistor may be formed in a second portion thereof. In example embodiments, the first conductive type may be a p-type, and the second conductive type may be an n-type. The substrate 100 may be either a p-type substrate or an n-type substrate.

An epitaxial layer 105 may be formed on the substrate 100. The epitaxial layer 105 may be lightly-doped with impurities. The epitaxial layer 105 may include first conductive type impurities. In example embodiments, the epitaxial layer 105 may be formed to a thickness of about 5-μm to about 15-μm.

A first conductive type well 110 may be formed at each of an upper portion of the epitaxial layer 105 in the third region C and an upper portion of the epitaxial layer 105 in the second portion of the fourth region D. A second conductive type well 115 may be formed at an upper portion of the epitaxial layer 105 in the first portion of the fourth region D.

Figure 2:
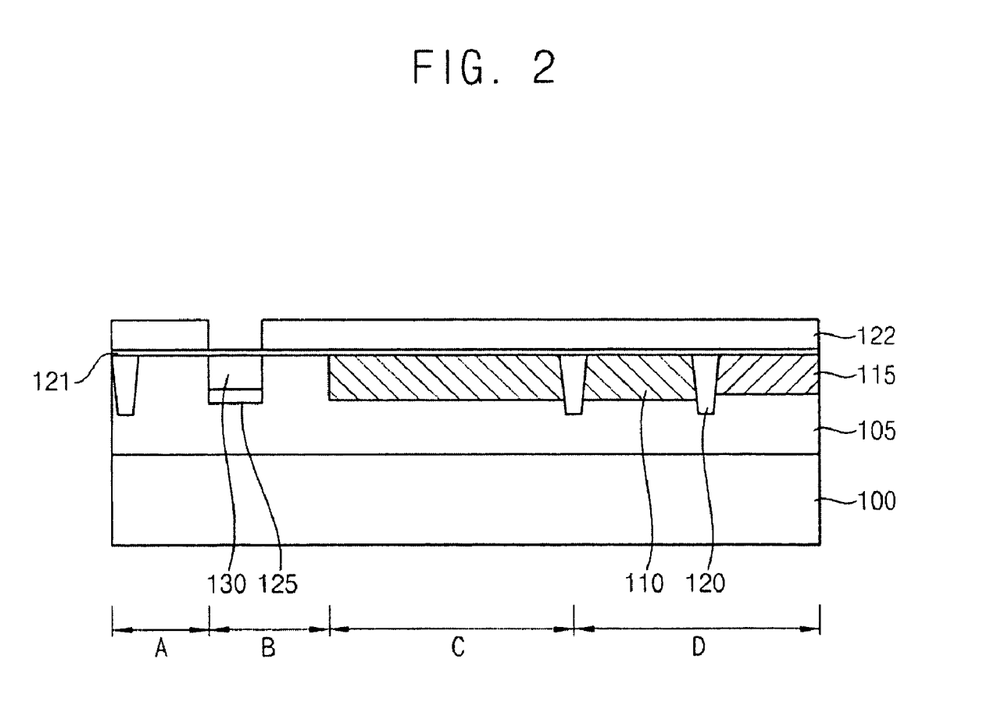

Referring to FIG. 2, an isolation layer 120 may be formed in the epitaxial layer 105. The isolation layer 120 may isolate photodiodes 140 (see FIG. 3) therebetween, or may isolate common devices and circuit elements therebetween. The isolation layer 120 may be formed to have different depths according to the location thereof. For example, the isolation layer 120 between the photodiodes 140 may have a depth deeper than that of the isolation layer 120 between the common devices and the circuit elements.

A pad oxide layer 121 may be formed on the epitaxial layer 105 and the isolation layer 120.

A first mask 122 may be formed on the pad oxide layer 121 to cover the first, third and fourth regions A, C and D, and the second portion of the second region B. First conductive type impurities and second conductive type impurities may be sequentially implanted into the epitaxial layer 105 using the first mask 122 as an ion implantation mask to form a first channel 125 and a second channel 130 at upper portions of the epitaxial layer 105. The first and second channels 125 and 130 may be used for the transfer transistor. The first mask 122 may be removed.

Figure 3:
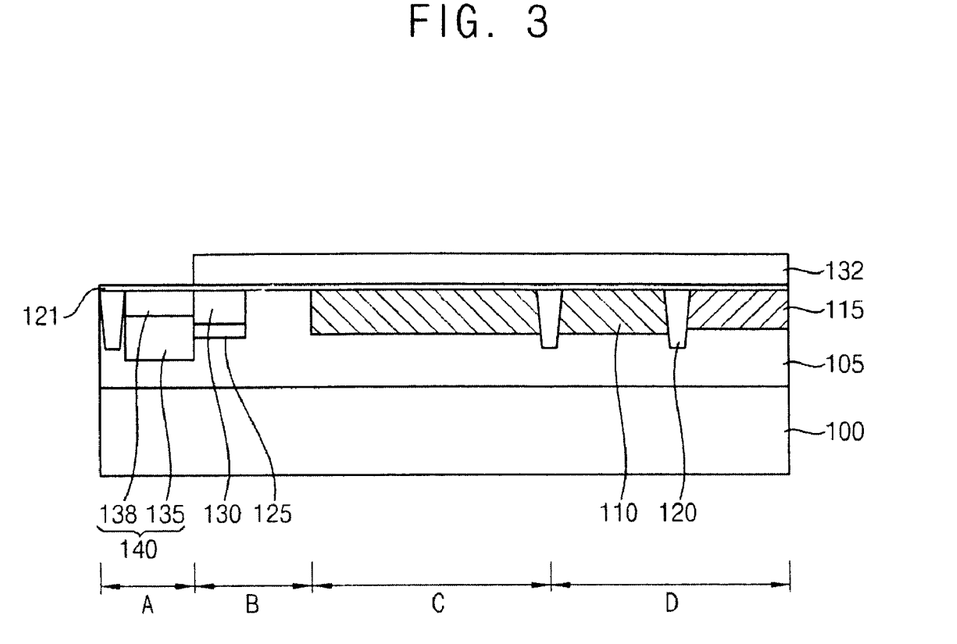

Referring to FIG. 3, the photodiode 140 may be formed at an upper portion of the epitaxial layer 105 in the first region A. Particularly, a second mask 132 may be formed on the pad oxide layer 121 to cover the second, third and fourth regions B, C and D. Second conductive type impurities and first conductive type impurities may be sequentially implanted into the upper portion of the epitaxial layer 105 using the second mask 132 as an implantation mask. A first impurity region 135 and a second impurity region 138 may be formed, respectively. the first impurity region 135 and the second impurity region 138 may form the photodiode 140. In example embodiments, the first impurity region 135 may be formed to have a depth of about 5-μm from a top surface of the epitaxial layer 105. The second mask 132 and the pad oxide layer 121 may be removed.

Figure 4:
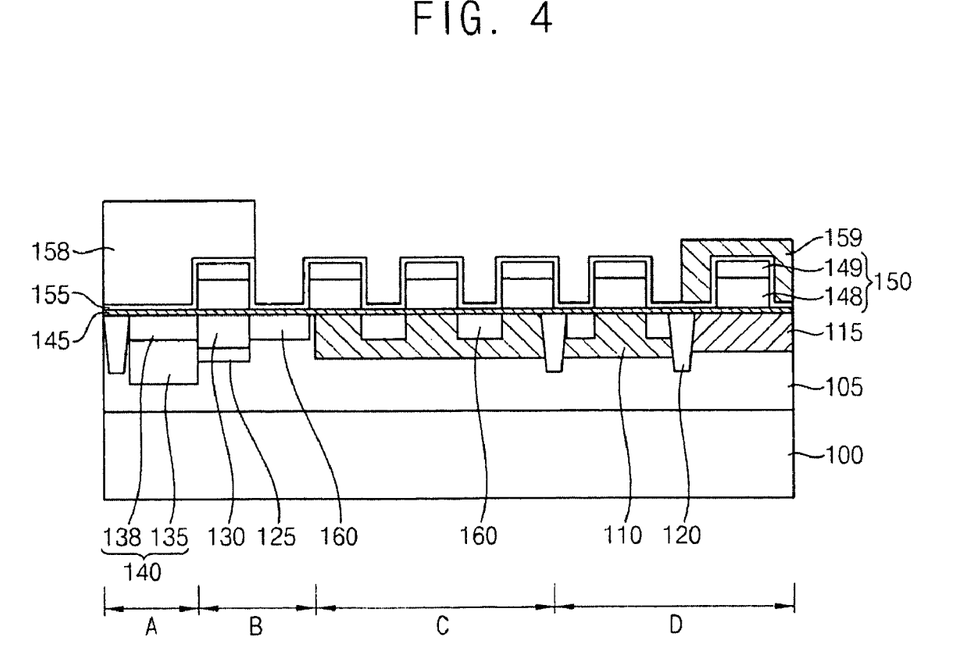

Referring to FIG. 4, a gate insulation layer 145 may be formed on the epitaxial layer 105 and the isolation layer 120. A plurality of gate structures 150 may be formed on the gate insulation layer 145 in the second, third and fourth regions B, C and D. Each of the gate structures 150 may include a gate electrode 148 and a hard mask 149.

In example embodiments, a first blocking layer 155 may be formed on the gate electrodes 150 and the gate insulation layer 145. The first blocking layer 155 may be formed conformally on the gate electrodes 150 and the gate insulation layer 145. The first blocking layer 155 may be formed to a thickness of about 200 Å by a chemical vapor deposition (CVD) process, or an atomic layer deposition (ALD) process, using a nitride. The first blocking layer 155 may prevent, or reduce, undesired impurities (e.g., metal ions) from diffusing into the epitaxial layer 105 if an ion implantation process is subsequently performed.

A third mask 158 may be formed on the first blocking layer 155 in the first region A and the first portion of the second region B. A fourth mask 159 may be formed on the first blocking layer 155 in the first portion of the fourth region D. Second conductive type impurities may be implanted into the epitaxial layer 105 by an implantation process using the third and fourth masks 158 and 159 and the gate structures 150 as an ion implantation mask to form a first lightly-doped impurity layer 160 at upper portions of the epitaxial layer 105 adjacent to the gate structures 150. The third and fourth masks 158 and 159 may be removed.

In other example embodiments, the first blocking layer 155 may be formed after forming the first lightly-doped impurity layer 160 by an ion implantation process and after removing the third and fourth masks 158 and 159.

Figure 5:
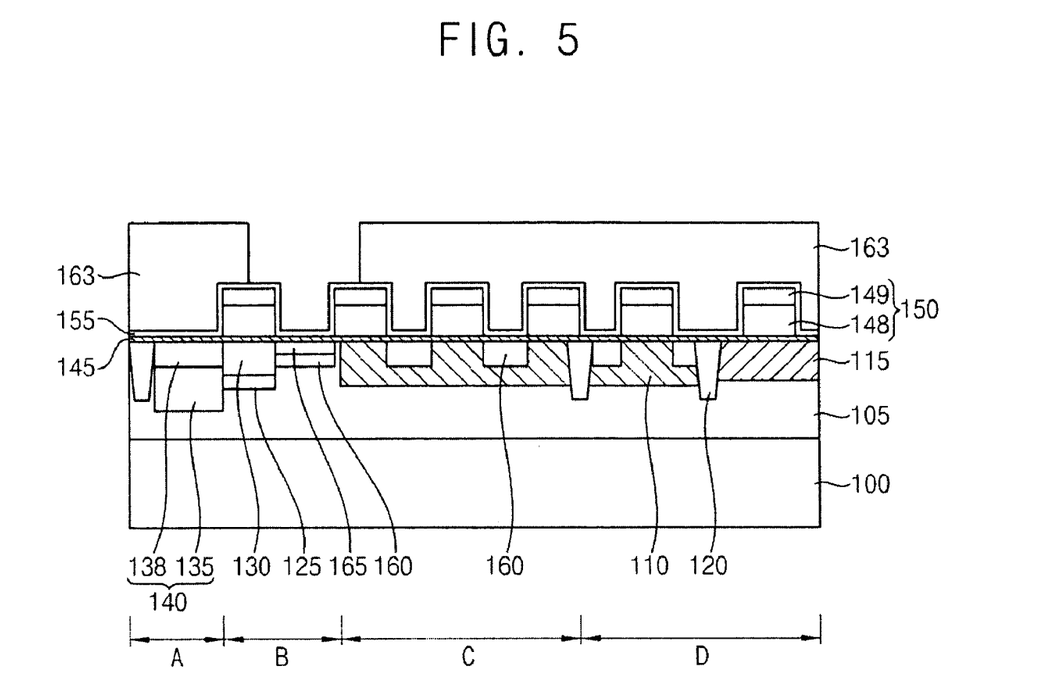

Referring to FIG. 5, a fifth mask 163 may be formed on the first blocking layer 155 to cover the first, third and fourth regions A, C and D. Second conductive type impurities may be implanted into the epitaxial layer 105 by an ion implantation process using the fifth mask 163 and the gate structures 150 as an ion implantation mask to form a first highly-doped impurity layer 165 at an upper portion of the first lightly-doped impurity layer 160. The first blocking layer 155 may prevent, or reduce, undesired impurities (e.g., metal ions) from diffusing into the epitaxial layer 105 if the first highly-doped impurity layer 165 is formed. The fifth mask 163 may be removed.

Figure 6:
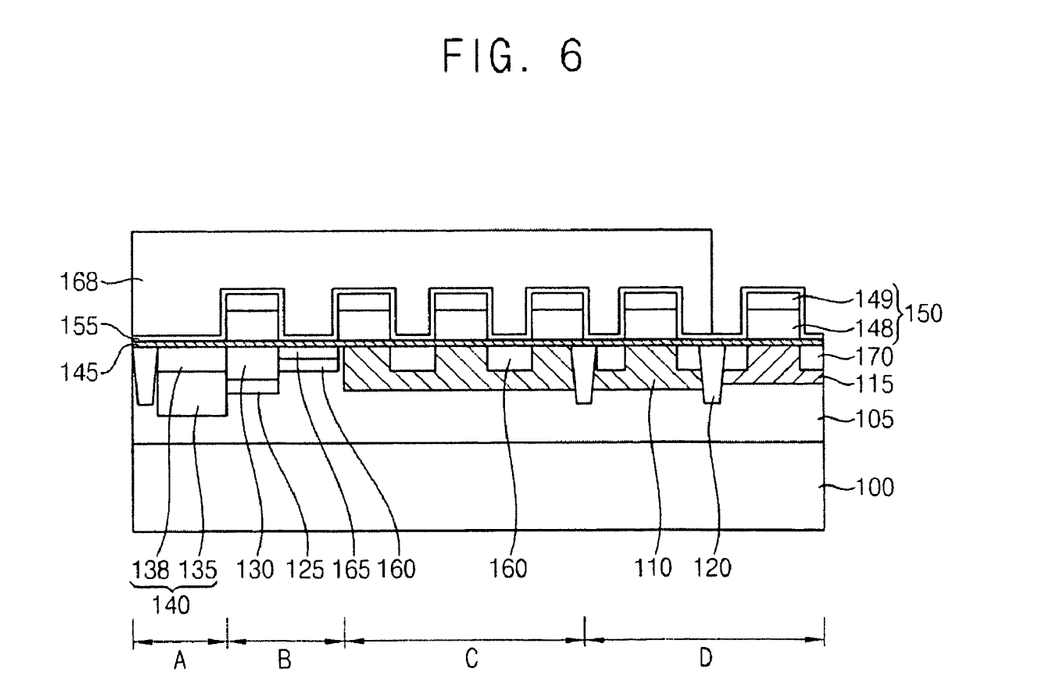

Referring to FIG. 6, a sixth mask 168 may be formed on the first blocking layer 155 to cover the first, second and third regions A, B and C, and the second portion of the fourth region D. First conductive type impurities may be implanted into the epitaxial layer 105 by an ion implantation process using the sixth mask 168 and the gate structures 150 as an ion implantation mask to form a second lightly-doped impurity layer 170 at an upper portion of the second conductive type well 115. The sixth mask 168 may be removed.

Figure 7:
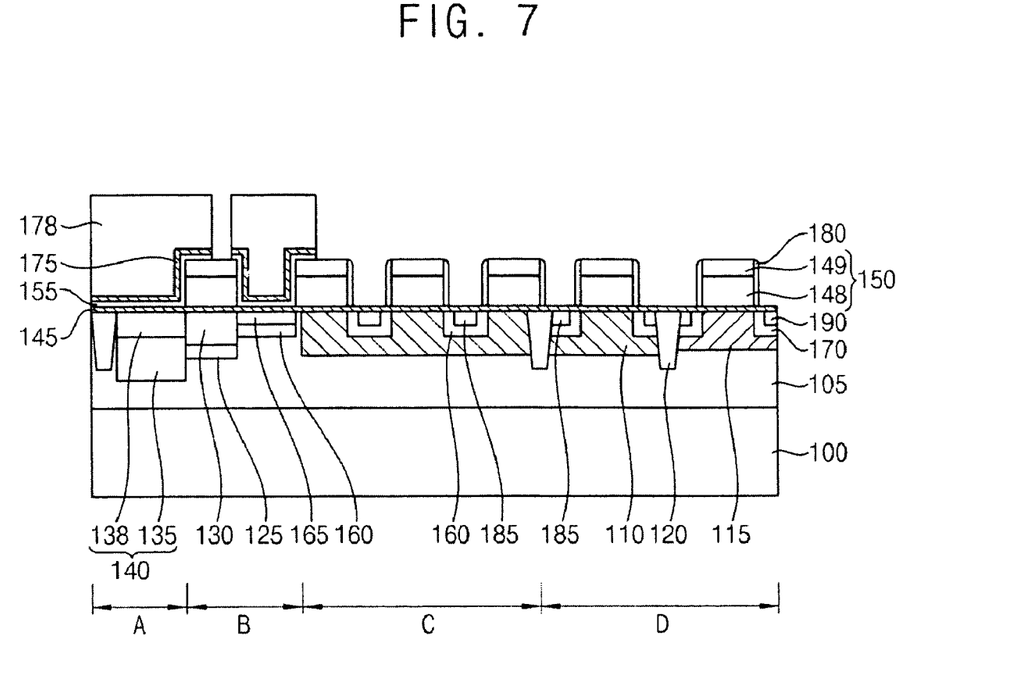

Referring to FIG. 7, a second blocking layer 175 may be formed on the first blocking layer 155 in the first and second regions A and B. A spacer 180 may be formed on sidewalls of the gate structures 150 in the third and fourth regions C and D. Particularly, a nitride layer (not shown) may be formed on the first blocking layer 155 to a thickness of about 500 Å by a CVD process. A seventh mask 178 may be formed on a portion of the nitride layer to cover the first and second regions A and B. The seventh mask 178 may expose a portion of the nitride layer over the gate structure 150 in the first portion of the second region B. The nitride layer may be partially removed by an etch back process. The second blocking layer 175 may be formed on the first blocking layer 155 in the first and second regions A and B. The spacer 180 may be formed on the sidewalls of the gate structures 150 in the third and fourth regions C and D.

In example embodiments, a portion of the first blocking layer 155 that is not covered by the seventh mask 178 may be also removed simultaneously with the nitride layer.

In other example embodiments, the portion of the first blocking layer 155 that is not covered by the seventh mask 178 may not be removed, thereby being used as an etch stop layer in a subsequent process.

A second highly-doped impurity layer 185 may be formed at an upper portion of the first lightly-doped impurity layer 160 in the third region C and at an upper portion of the first lightly-doped impurity layer 160 in the second portion of the fourth region D. A third highly-doped impurity layer 190 may be formed at an upper portion of the second lightly-doped impurity layer 170 in the first portion of the fourth region D. Particularly, second conductive type impurities may be implanted into the epitaxial layer 105 to form the second highly-doped impurity layer 185 by an ion implantation process using the seventh mask 178 and an eighth mask (not shown) covering the gate structure 150, the first blocking layer 155, the spacer 180 and the gate insulation layer 145 in the first portion of the fourth region D. First conductive type impurities may be implanted into the epitaxial layer 105 to form the third highly-doped impurity layer 190 by an ion implantation process using the seventh mask 178 and a ninth mask (not shown) covering the gate structure 150, the first blocking layer 155, the spacer 180 and the gate insulation layer 145 in the third region C and the second portion of the fourth region D.

Figure 8:
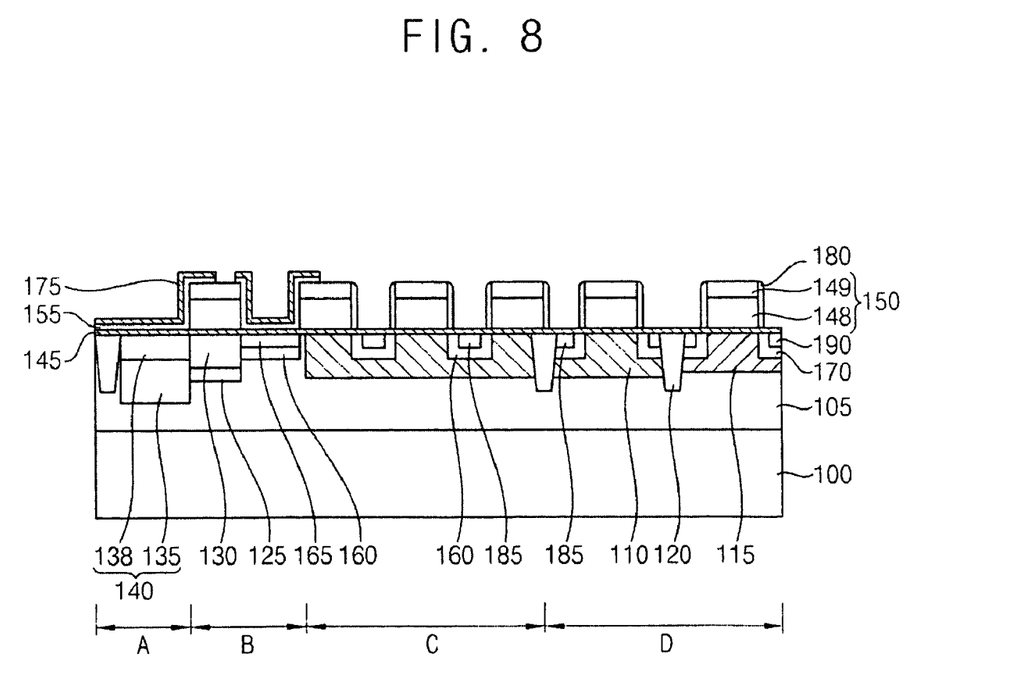

Referring to FIG. 8, after removing the seventh mask 178, a cleaning process may be performed. In example embodiments, if the portion of the first blocking layer 155 that is not covered by the seventh mask 178 is already removed, an etch stop layer (not shown) may be formed using a nitride.

The first highly-doped impurity layer 165 in the second region B (e.g., the floating diffusion region) may not be formed during the same ion implantation process as that of the second highly-doped impurity layer 185 in the third and fourth regions C and D (e.g., the APS transistor region and the peripheral circuit region). Thus, the first and second highly-doped impurity layers 165 and 185 may not be formed using the same mask. If the first highly-doped impurity layer 165 is formed in the second region B, the blocking layer 155 may prevent (or reduce) undesired impurities from being diffused into the epitaxial layer 105 such that the first highly-doped impurity layer 165 may have a junction depth smaller than that of the second highly-doped impurity layer 185.

The first highly-doped impurity layer 165 in the second region B may not have undesired impurities (e.g., metal ions), thereby being very (or substantially) pure. As such, the CIS including the first highly-doped impurity layer 165 may not have white spots.

Figure 9:
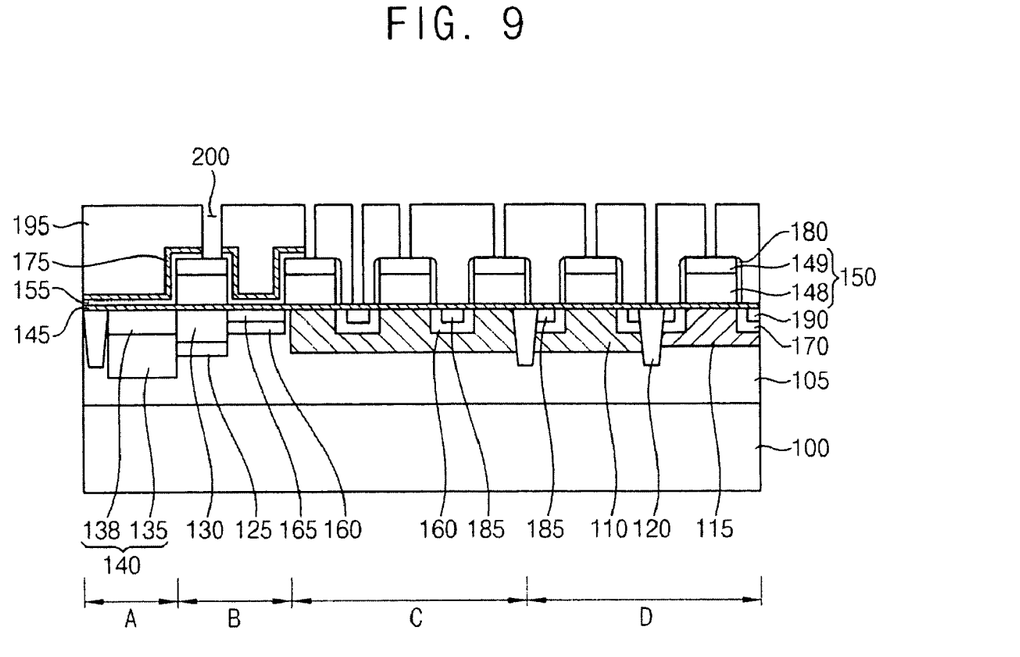

Referring to FIG. 9, a first insulating interlayer 195 may be formed on the gate structures 150, the gate insulation layer 145, the first and second blocking layers 155 and 175 and the spacer 180. The first insulating interlayer 195 may be formed by a CVD process using an oxide (e.g., high density plasma (HDP) oxide). A plurality of contact holes 200 exposing portions of the gate structures 150, respectively, may be formed through the first insulating interlayer 195.

Figure 10:
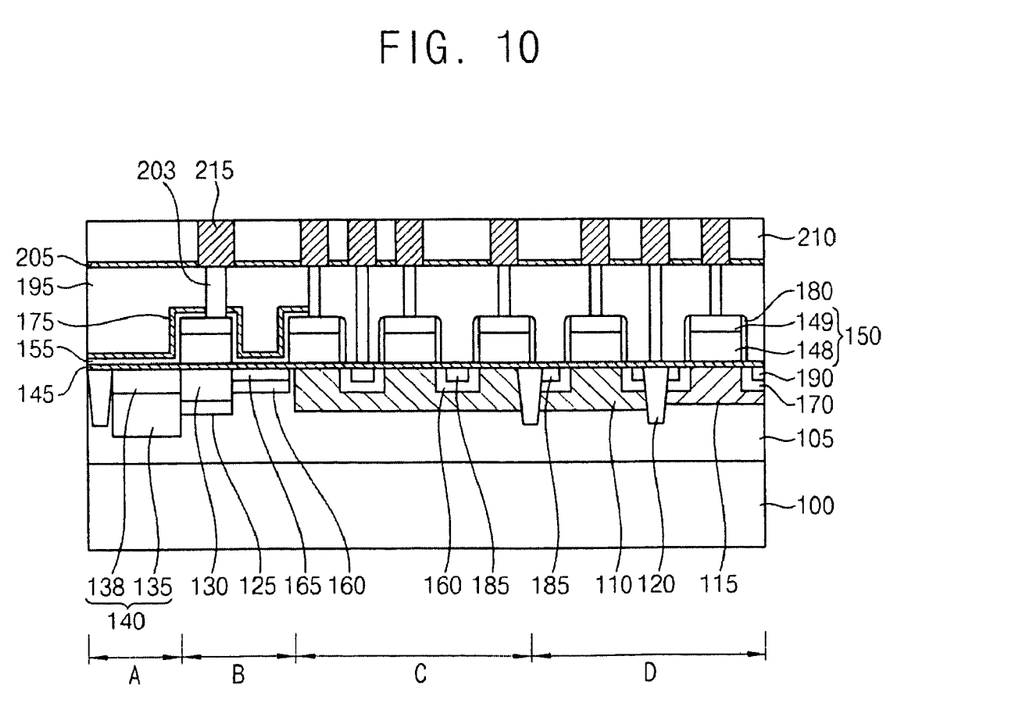

Referring to FIG. 10, a plurality of first plugs 203 may be formed to fill the contact holes 200, respectively. The first plugs 203 may be formed using a metal, a metal nitride, polysilicon or the like.

A first etch stop layer 205 may be formed on the first insulating interlayer 195 and the first plugs 203. The first etch stop layer 205 may be formed using a nitride. A second insulating interlayer 210 may be formed on the first etch stop layer 205. A first metal wiring 215 may be formed through the second insulating interlayer 210 to be electrically connected to the plugs 203.

Figure 11:
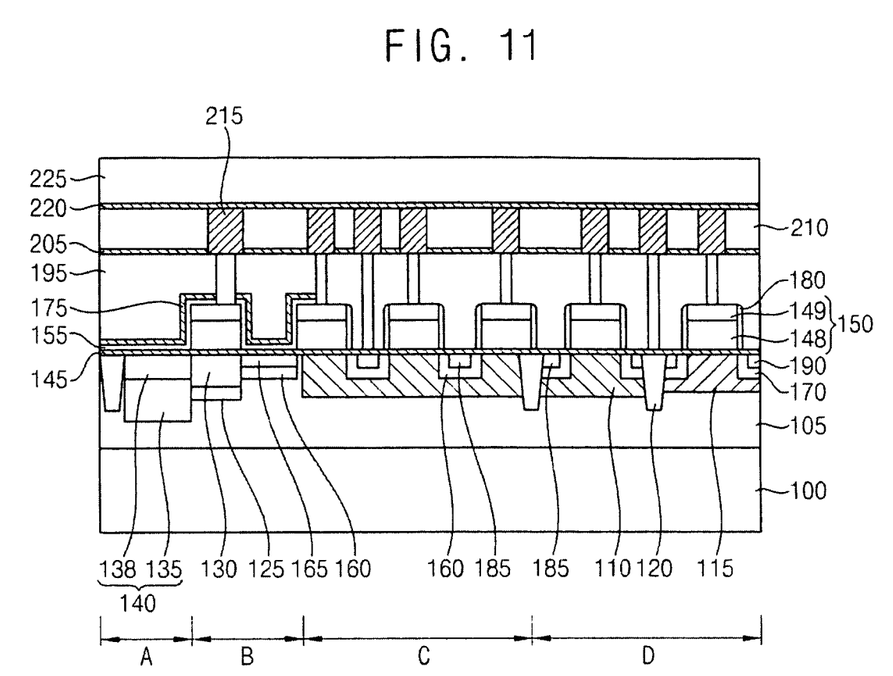

Referring to FIG. 11, a second etch stop layer 220 may be formed on the second insulating interlayer 210 and the first metal wiring 215. A third insulating interlayer 225 may be formed on the second etch stop layer 220.

Figure 12:
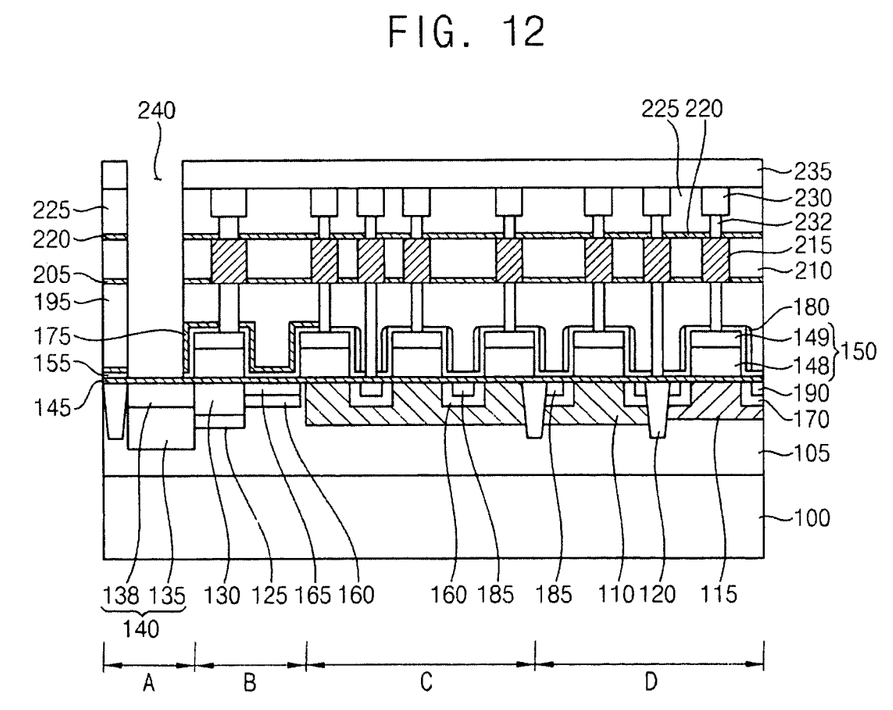

Referring to FIG. 12, second plugs 232 and a second metal wiring 230 may be formed in the third insulating interlayer 225 to be electrically connected to the first metal wiring 215. A protection layer 235 may be formed on the second metal wiring 230 and the third insulating interlayer 225.

An opening 240 may be formed through the protection layer 235, the third insulating interlayer 225, the second etch stop layer 220, the second insulating interlayer 215, the first etch stop layer 205, the first insulating interlayer 195, the second blocking layer 175 and the first blocking layer 155.

Figure 13:
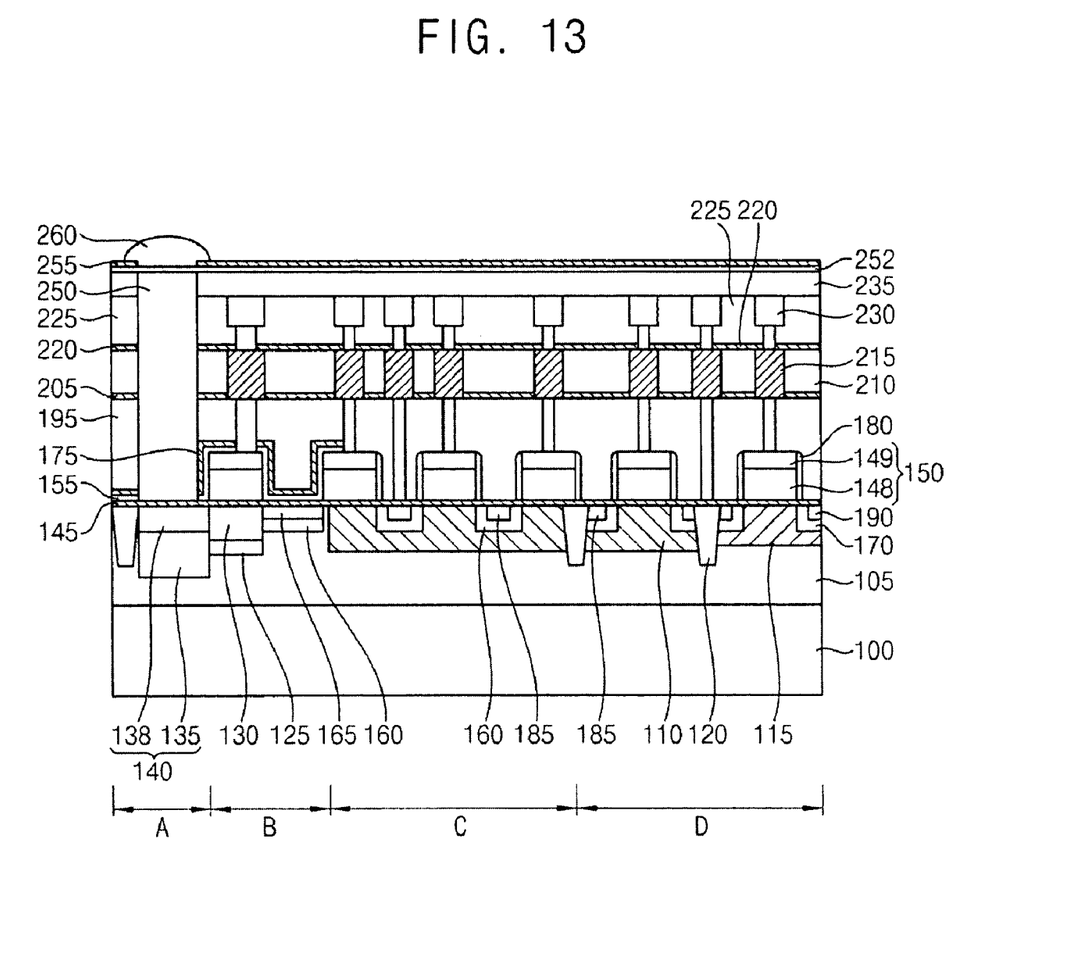

Referring to FIG. 13, a light transmission layer 250 may be formed to fill the opening 240. The light transmission layer 250 may be formed using resin. A color filter layer 252 may be formed on the light transmission layer 250 and the protection layer 235.

The color filter layer 252 may include a plurality of color filter arrays (not shown). In example embodiments, at least three color filter arrays may be formed. A light blocking layer 255 may be formed on the color filter layer 252. A portion of the light blocking layer 255 on the color filter array may be removed. A microlens 260 may be formed on the color filter array.

Figure 14:
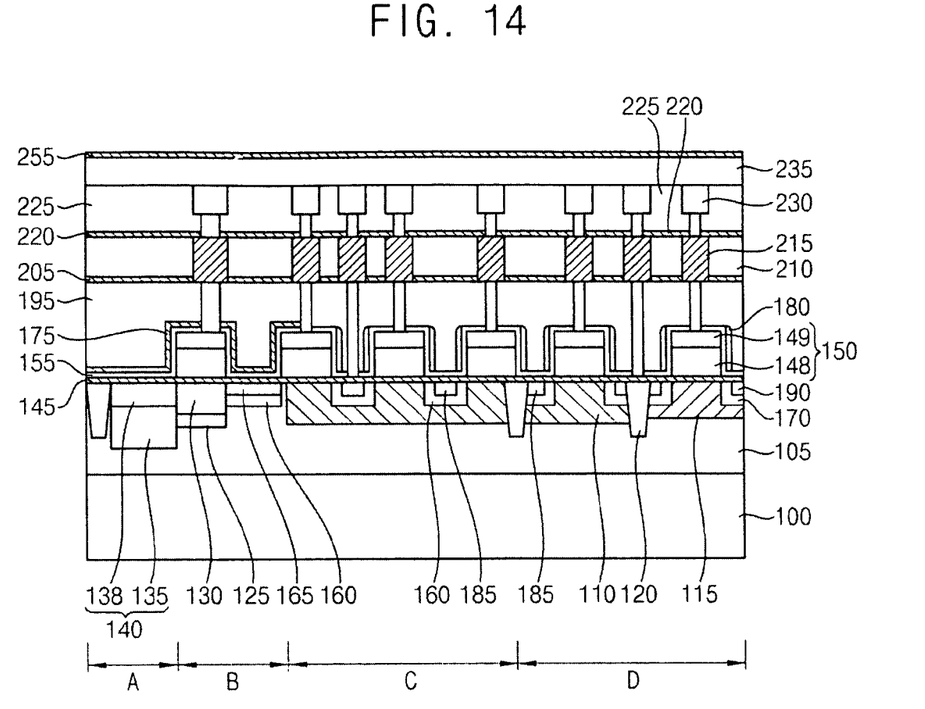
FIGS. 14 to 16 are cross-sectional views illustrating a method of manufacturing a CIS in accordance with example embodiments.
Figure 15:
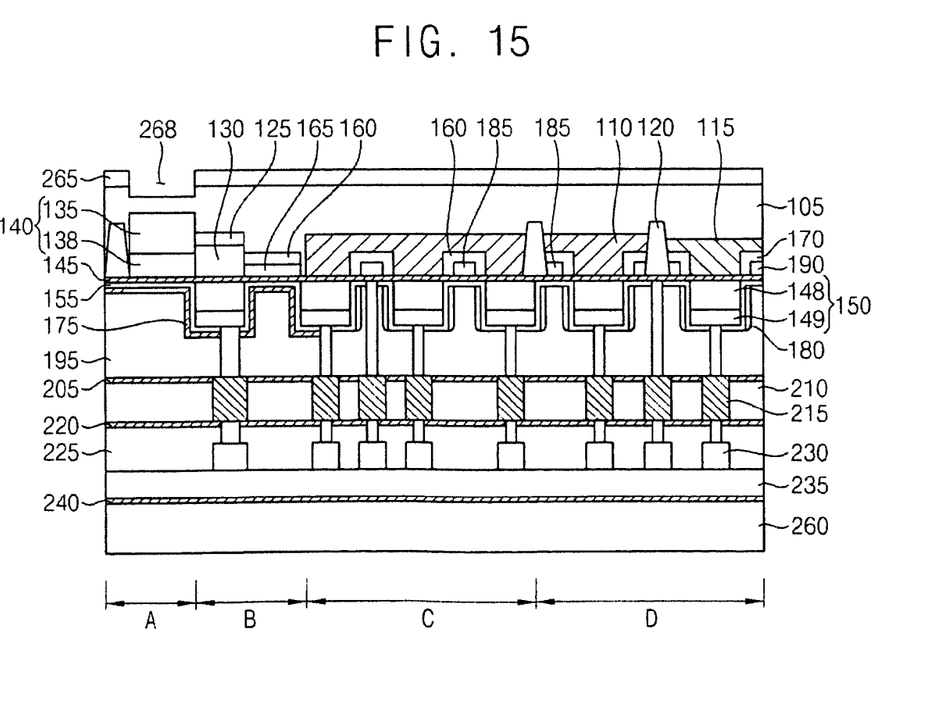
Figure 16:
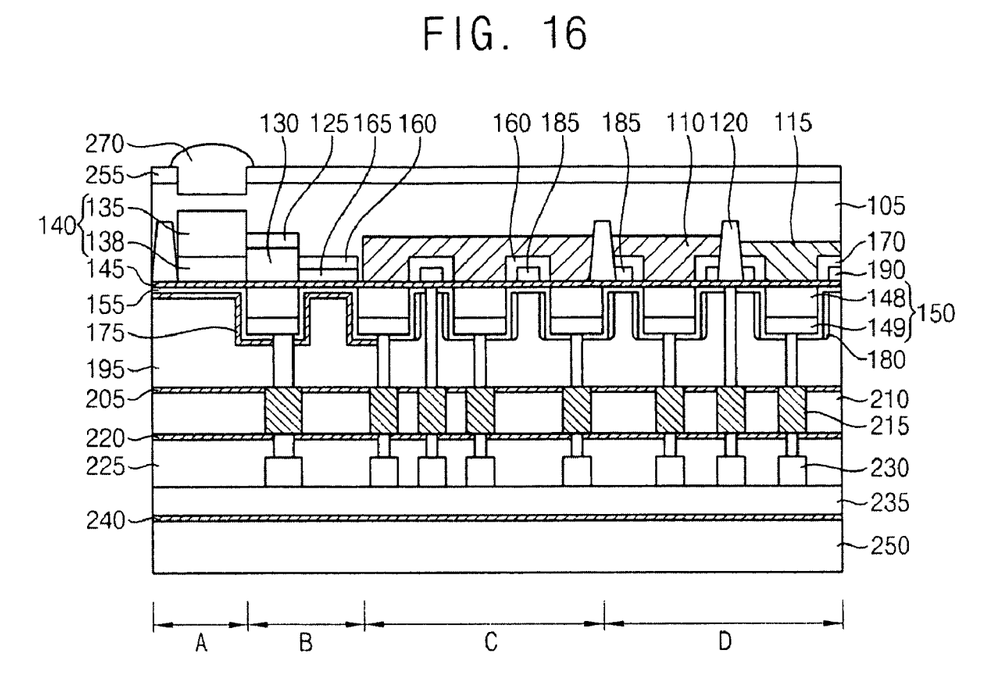

FIGS. 14 to 16 are cross-sectional views illustrating a method of manufacturing a CIS in accordance with example embodiments. This method includes the processes substantially the same as, or similar to, those of the method illustrated with FIGS. 1 to 13. Thus, like numerals refer to like element, and repetitive explanations are omitted here for the sake of brevity.

Referring to FIG. 14, the structure illustrated with FIG. 13 may be formed except for the light transmission layer 250, the color filter layer 252 and the microlens 260.

Referring to FIG. 15, a subsidiary substrate 260 may be attached onto the first blocking layer 255. For convenience of manufacturing, the resultant structure may be turned over. The substrate 100 may be removed by a thinning process to expose the epitaxial layer 105.

A second light blocking layer 265 may be formed on the epitaxial layer 105. A portion of the second light blocking layer 265 in the first region A may be removed to form a hole 268.

Referring to FIG. 16, after forming a color filter array (not shown) in the hole 268, a microlens 270 may be formed to fill the remaining portion of the hole 268, forming a CIS having a backside illumination (BSI) architecture.

Figure 17:
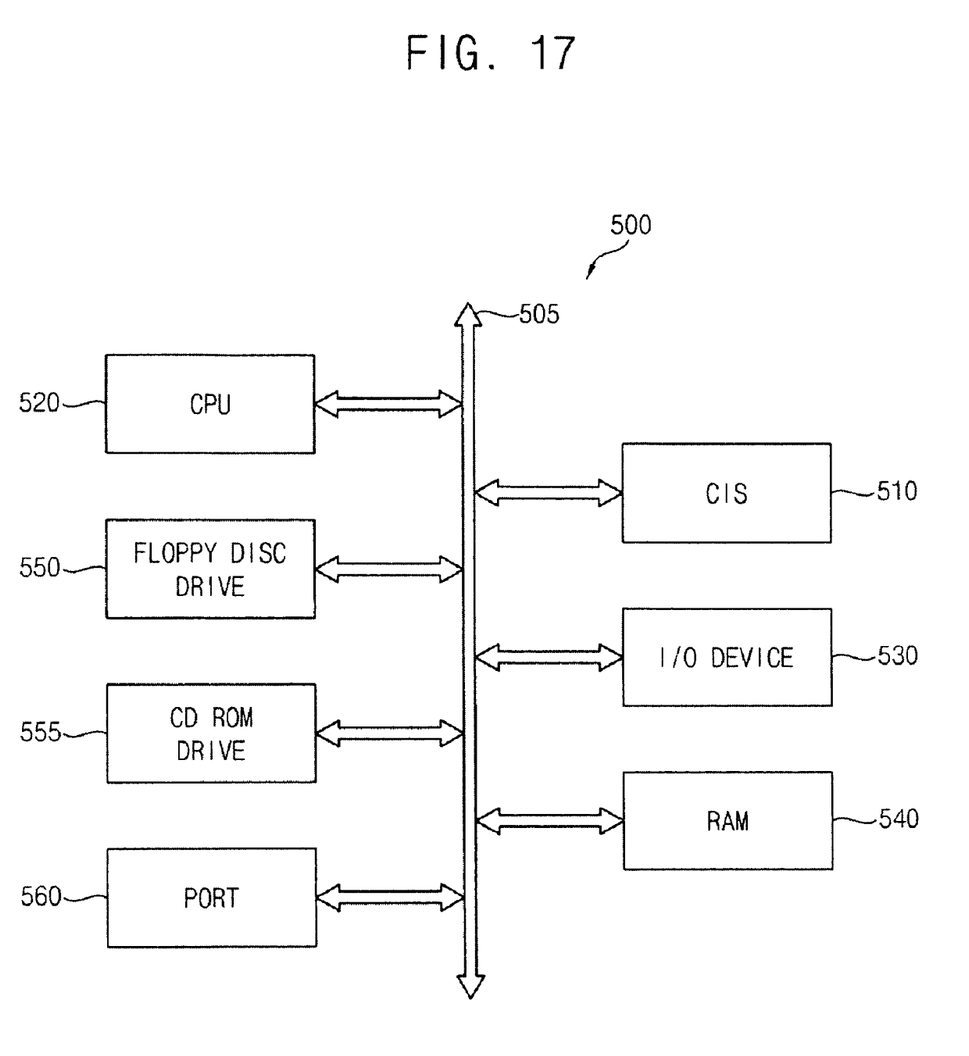
FIG. 17 is a block diagram illustrating a system having a CIS including a blocking layer in accordance with example embodiments.

FIG. 17 is a block diagram illustrating a system having a CIS including a blocking layer in accordance with example embodiments.

Referring to FIG. 17, a system 500 may handle output images of a CIS 510. The system 500 may include a computer system, a camera system, a scanner, an image security system, etc.

The system 500 may include a central processing unit (CPU) 520 that may communicate with an input/output (I/O) device 530 via a bus 505. The CPU 520 may be electrically connected to a floppy disk drive 550, a CD-ROM drive 555, a port 560 and a random access memory (RAM) 540 through the bus 505. Data may be transferred to the CPU 520, the floppy disk drive 550, the CD-ROM drive 555, the port 560 and the random access memory (RAM) 540 through the bus 505. Thus, the CIS output image may be produced.

The port 560 may be coupled with a video card, a sound card, a memory card, a USB device, or the like. The port 560 may communicate with other systems.

The CIS 510 may be mounted on a chip (not shown) with the CPU 520, a digital signal processing (DSP) device or a memory device (not shown).

Figure 18:
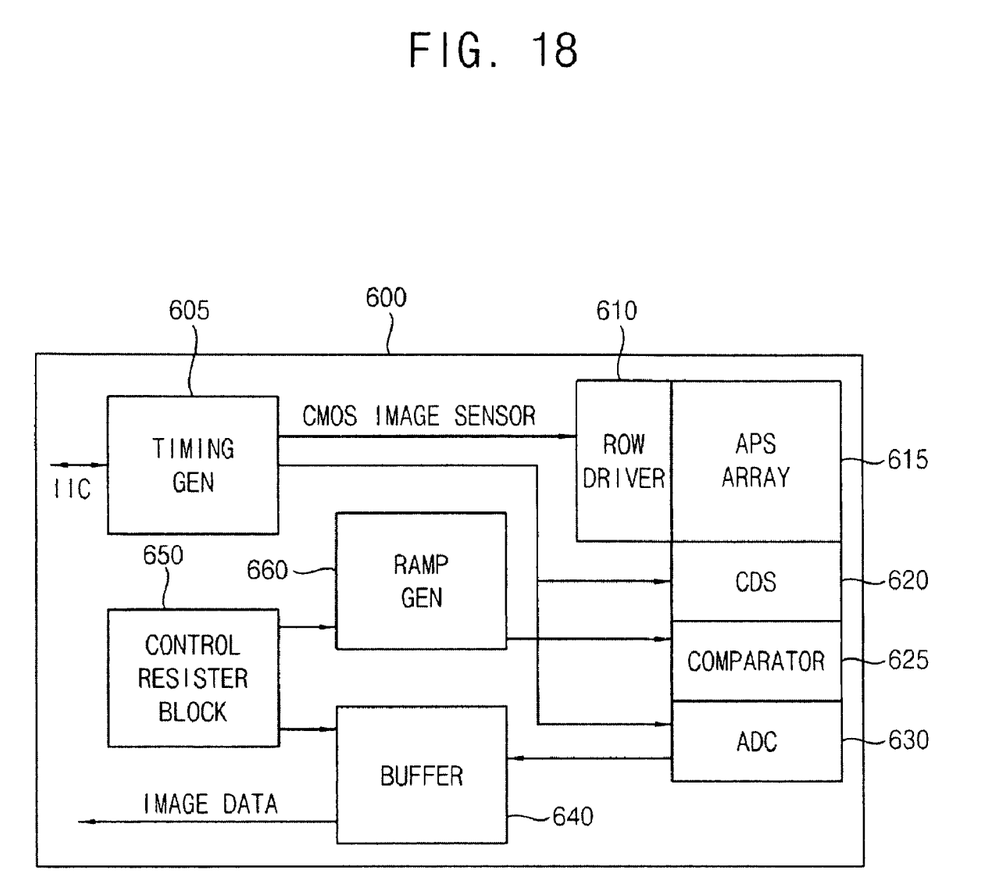
FIG. 18 is a block diagram illustrating a CIS chip including a blocking layer in accordance with example embodiments.

FIG. 18 is a block diagram illustrating a CIS chip including a blocking layer in accordance with example embodiments.

Referring to FIG. 18, a CIS chip 600 may include a timing generator 605, an APS array 615, a correlated double sampler (CDS) 620, a comparator 625, an analog-to-digital converter (ADC) 630, a buffer 640 and a control register block 650.

Light data of an object collected by an optical lens of the APS array 615 may be converted to electrons. The converted electrons may be converted to voltage signals. In the voltage signals, noises may be removed and some signals may be selected in the CDS 620. The selected signals may be compared in the comparator 625, and analog signals may be converted to digital signals in the ADC 630. The digitized signals may flow through the buffer 640, and the object image may be produced.

Figure 19:
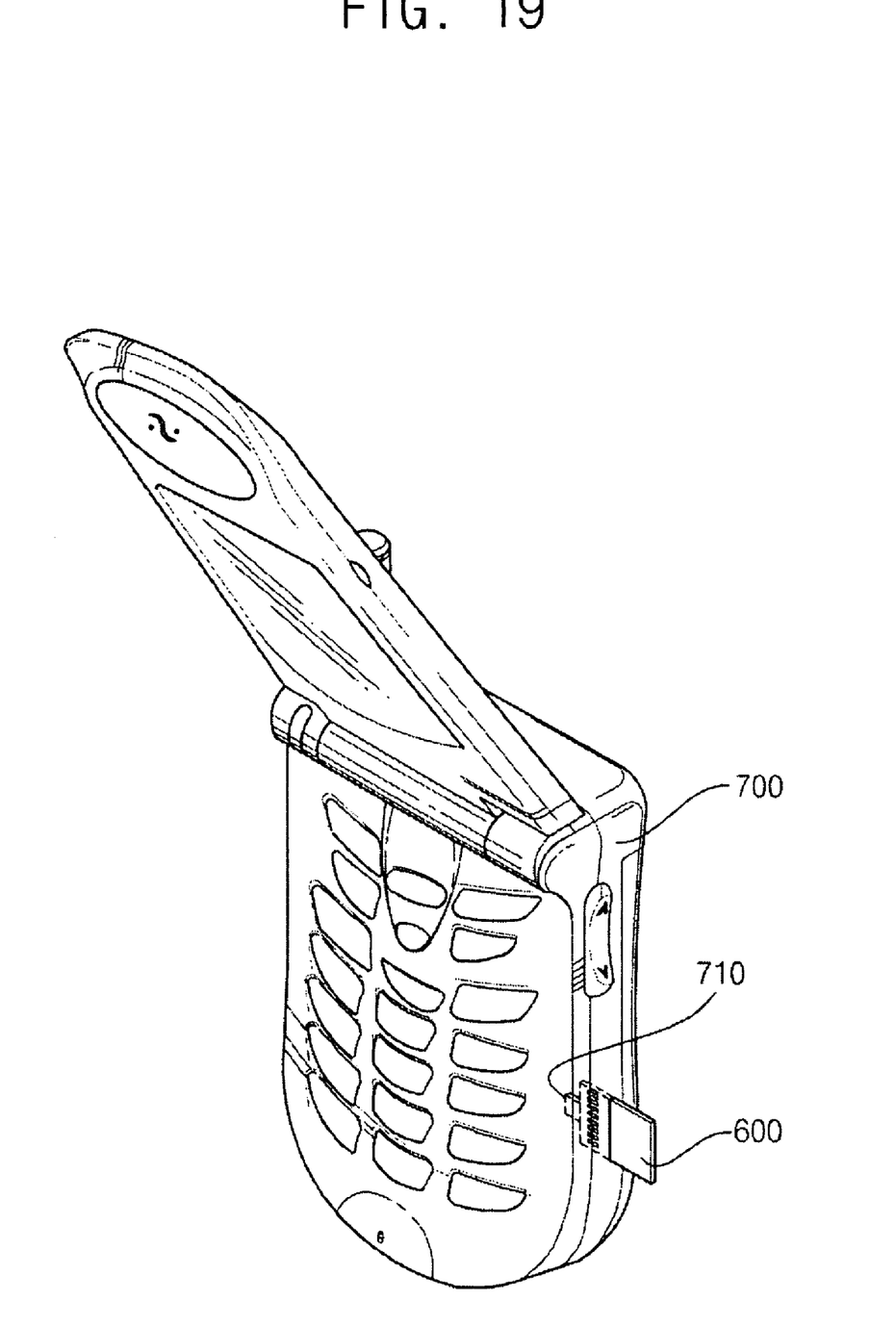
FIG. 19 illustrates a camera phone including a CIS chip including a blocking layer in accordance with example embodiments.

FIG. 19 illustrates a camera phone including a CIS chip including a blocking layer in accordance with example embodiments.

Referring to FIG. 19, a camera phone 700 includes a DSP 710 having a camera controller (not shown) and an image signal processor (not shown). The DSP 710 may be electrically connected to the CIS chip 600 illustrated with FIG. 18.

According to example embodiments, in a method of manufacturing a CIS, a blocking layer may prevent (or reduce) undesired impurities from being diffused into a floating diffusion layer or a photodiode such that white spots may not occur. As such, the CIS may have increased resolution and/or increased electrical characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages. Accordingly, all such modifications are intended to be included within the scope as defined in the claims. Therefore, it is to be understood that the foregoing is illustrative of various example embodiments and is not to be construed as limited to the example embodiments disclosed, and that modifications to the disclosed example embodiments, as well as other example embodiments, are intended to be included within the scope of the appended claims.

What is claimed is:

1. A method of manufacturing a complementary metal-oxide semiconductor (CMOS) image sensor (CIS), the method comprising:
   forming an epitaxial layer on a substrate in which a first, second, third and fourth region are each defined;
   forming a photodiode in an upper portion of the epitaxial layer in the first region;
   forming a plurality of gate structures on the epitaxial layer in the second, third and fourth regions;
   forming a first blocking layer on the plurality of gate structures and the epitaxial layer;
   forming a first lightly-doped impurity layer in the upper portion of the epitaxial layer using a first mask and the plurality of gate structures as an ion implantation mask, the first mask covering the first region and a portion of the second region;
   forming a first highly-doped impurity layer in the upper portion of the epitaxial layer using a second mask and the plurality of gate structures as an ion implantation mask, the second mask covering the first, third and fourth regions;
   forming a second highly-doped impurity layer in the upper portion of the epitaxial layer using a third mask and the plurality of gate structures as an ion implantation mask, the third mask covering the first and second regions;
   forming a color filter layer over the photodiode; and
   forming a microlens on the color filter layer.

2. The method of claim 1, wherein forming the first lightly-doped impurity region, the first highly-doped impurity region and the second highly-doped impurity region includes implanting a plurality of first conductive type impurities.

3. The method of claim 1, further comprising:
   forming a second lightly-doped impurity layer in the upper portion of the epitaxial layer using a fourth mask and the plurality of gate structures as an ion implantation mask after forming the first highly-doped impurity layer and prior to forming the second highly-doped impurity layer, wherein the first mask covers a first portion of the fourth region, and the fourth mask covers the first, second, third and fourth regions.

4. The method of claim 1, further comprising:
   forming a nitride layer on the first blocking layer, after forming the first highly-doped impurity layer; and
   partially removing the nitride layer using the third mask as an etching mask to form a second blocking layer and a spacer,
   wherein the second blocking layer is formed on the first blocking layer in the first and second regions and the spacer is formed on each sidewall of the plurality of gate structures in the third and fourth regions.

5. The method of claim 4, wherein a portion of the first blocking layer beneath the nitride layer is removed during the partial removal of the nitride layer.

6. The method of claim 1, further comprising:
   forming a second lightly-doped impurity layer in the upper portion of the epitaxial layer using a fourth mask and the plurality of gate structures as an ion implantation mask after forming the first highly-doped impurity layer and prior to forming the second highly-doped impurity layer, wherein the first mask covers a first portion of the fourth region, and the fourth mask covers the first, second, third and fourth regions; and
   forming a third highly-doped impurity layer in the upper portion of the epitaxial layer using a fifth mask and the plurality of gate structures as an ion implantation mask after forming the second highly-doped impurity layer and prior to forming the color filter layer, the fifth mask covering the first, second and third regions and the second portion of the fourth region.

7. The method of claim 6, wherein the second lightly-doped impurity layer and the third highly-doped impurity layer include a plurality of first conductive type impurities, and the first lightly-doped impurity layer and the first and second highly-doped impurity layers include a plurality of second conductive type impurities.

8. The method of claim 1, further comprising forming a second light blocking layer over the epitaxial layer, wherein the color filter layer and the microlens are formed over the second light blocking layer and the first blocking layer is formed over a subsidiary substrate.

* * * * *